(12) United States Patent
Flanagan, IV

(10) Patent No.: US 9,978,557 B2
(45) Date of Patent: May 22, 2018

(54) SYSTEM FOR ORIENTING A SAMPLE USING A DIFFRACTION PATTERN

(71) Applicant: FEI Company, Hillsboro, OR (US)

(72) Inventor: John Francis Flanagan, IV, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days. days.

(21) Appl. No.: 15/135,205

(22) Filed: Apr. 21, 2016

(65) Prior Publication Data

US 2017/0309441 A1   Oct. 26, 2017

(51) Int. Cl.
*H01J 37/20* (2006.01)
*H01J 37/26* (2006.01)

(52) U.S. Cl.
CPC ............ *H01J 37/20* (2013.01); *H01J 37/261* (2013.01); *H01J 2237/2826* (2013.01)

(58) Field of Classification Search
USPC ....................................................... 250/307
See application file for complete search history.

(56) References Cited

U.S. PATENT DOCUMENTS

| | | | |
|---|---|---|---|
| 8,253,099 B2 * | 8/2012 | Nicolopoulos | G01N 23/20058 250/307 |
| 2007/0023659 A1 | 2/2007 | Sergeevich et al. | |
| 2007/0045558 A1 | 3/2007 | Maas et al. | |
| 2008/0185286 A1 | 8/2008 | Lehmann | |
| 2009/0200464 A1 | 8/2009 | Tiemeijer et al. | |
| 2011/0049344 A1 * | 3/2011 | Dobashi | H01J 37/222 250/252.1 |
| 2011/0220796 A1 | 9/2011 | Nicolopoulos et al. | |
| 2011/0315876 A1 | 12/2011 | Buijsse et al. | |
| 2012/0001068 A1 | 1/2012 | He et al. | |
| 2012/0199756 A1 | 8/2012 | Buijsse et al. | |
| 2013/0062520 A1 | 3/2013 | Henstra et al. | |
| 2013/0105689 A1 | 5/2013 | Bischoff et al. | |
| 2014/0061463 A1 | 3/2014 | Buijsse et al. | |
| 2014/0070113 A1 | 3/2014 | Straw et al. | |

OTHER PUBLICATIONS

"ASTAR Application Notes Nanoscale TEM Orientation Imaging Analysis" NanoMEGAS SPRL; obtained Apr. 4, 2016, www.nanomegas.com, 32 pages.

Jansen, J. et al., "Towards automatic alignment of a crystalline sample in an electron microscope along a zone axis," Ultramicroscopy 125 (2013) pp. 59-65.

* cited by examiner

*Primary Examiner* — Phillip A Johnston
(74) *Attorney, Agent, or Firm* — Scheinberg & Associates, PC; Michael O. Scheinberg

(57) ABSTRACT

A method and apparatus are provided for aligning a sample in a charged particle beam system. The charged particle beam is directed toward the sample to obtain a sample diffraction pattern. The sample diffraction pattern is compared with reference diffraction patterns having known misalignments to determine which reference pattern most closely matches the sample pattern. The known alignment of the best-matching reference diffraction pattern is used to correct the tilt of the sample. The "patterns" compared can be lists of bright spots with corresponding intensities rather than images.

20 Claims, 9 Drawing Sheets

Beta tilt

US 9,978,557 B2

SYSTEM FOR ORIENTING A SAMPLE USING A DIFFRACTION PATTERN

TECHNICAL FIELD OF THE INVENTION

The present invention relates to improving alignment of a crystalline sample in a charged particle microscope.

BACKGROUND OF THE INVENTION

Charged-particle-beam microscopy is useful for measuring nanoscale features on a specimen. For accurate measurement, the charged particle beam should impact the specimen perpendicular to the sample surface. If the feature to be measured is tilted with respect to the beam, the measurement will be inaccurate. Aligning the sample crystal structure with the beam is referred to as "zone axis alignment." A "zone axis" is a major axis of symmetry of the crystal.

Because of the wave nature of electrons, electrons that pass through a crystalline sample interfere with each other, reinforcing the electron beam in some regions and cancelling the beam in other regions. The interference forms a diffraction pattern on the back focal plane of an objective lens positioned below the sample. The diffraction pattern consists of a pattern of bright spots on a darker background. Each bright region represents a peak in the electron signal caused by diffraction from a specific set of planes within the crystal structure. The position of the spots in the diffraction pattern can therefore be used to identify the type of material in the sample. Identifying the set of crystal planes corresponding to a particular spot is referred to as "indexing" the spot. Indexing can be performed using geometrical relationships of the crystal planes and the microscope geometry.

FIG. 1 shows an example of an electron beam diffraction pattern 102 composed of diffraction spots 104. The symmetry of the pattern indicates that the electron beam is parallel to a zone axis of the crystal. Tilting the specimen, so that the beam is no longer parallel to the zone axis, has a pronounced effect on the diffraction pattern. A tilted specimen produces a pattern that appears as a series of diffraction spots arranged in an arc, known as a Laue circle. FIG. 2 shows a sample diffraction pattern 202 from a sample tilted with respect to the electron beam, with the diffraction spots 204 forming an arc. From the diffraction pattern, it is possible to determine the tilt of the zone axis of the sample relative to the electron beam. Once the tilt is determined, the sample can be reoriented to align it with the beam.

One method of using a diffraction pattern to align a sample with a beam is described by Jansen et al, "Towards automatic alignment of a crystalline sample in an electron microscope along a zone axis," *Ultramicroscopy* 125(2013) 59-65. The degree and direction of specimen misalignment is determined by fitting a circle 302 to the arc of diffraction points 304 as shown in FIG. 3. The direction and magnitude of the radius vector 306 between the center 308 of the fitted circle and the transmitted beam spot of the diffraction pattern arc correspond to the direction and magnitude of specimen misalignment. The radius vector is converted to a stage tilt to reorient the zone axis to be parallel to the beam as indicated by the diffraction pattern of FIG. 4 acquired after correction. The method may be iterated until desired alignment is achieved. Once the sample is aligned, features on the sample can be accurately measured.

This method is based on heuristics, and is relatively slow. It can be difficult or impossible to fit a circle to some diffraction patterns. For example, in the pattern of FIG. 5, it can be difficult to determine which points to include in the circle fitting. In the image shown in FIG. 6, taken from a sample in which the beam is oriented far from the sample zone axis, not many spots are visible, and the spots that are visible do not appear to form a circle at all. In addition, the pattern of FIG. 6 appears to suffer from 'two beam' dynamic diffraction. The classical diffraction model assumes the particle (X-ray or electron) scatters only once during its interaction with the specimen. Electrons strongly interact with matter, so multiple scatter events occur. The beam scatters, then the scattered beam scatters again, etc. This phenomenon is known as dynamic diffraction. Thicker material causes more scattering. For silicon having a thickness of less than about 20 nm, dynamic diffraction can be safely ignored. Dynamic diffraction can cause the Laue circle method to fail. In addition, the method is not useful if the sample misalignment is less than 1 degree, because the diffraction pattern is not sufficiently circular for matching. Moreover, it can be difficult to determine the accuracy of the tilt measurement from circle-fitting routines.

There are several other ways of determining zone axis tilt using diffraction patterns. For example, using the Weiss zone law, in which the pattern is indexed and two-three prominent spots are selected to find the zone axis. This method is only accurate to about 2-3 degrees at best, which is inadequate for crystal alignment.

Using Kikuchi lines is a very accurate, standard technique for determining zone axis tilt. It can be done manually and/or with computer aid. Kikuchi lines result from dynamic diffraction effects and are only readily visible with thick and/or high Z (atomic number) samples. The Kikuchi line technique is therefore not possible for use with thin samples, such as samples utilized in electronics industry where node sizes are now approaching 10 nm.

Another method entails indexing a series of diffraction patterns and computing the crystal unit cell parameters and orientation using least squares methods. This method requires more than one diffraction pattern and involves tilting the stage, which causes translation in XYZ. This is highly undesirable for aligning the crystal orientation in an electron beam system because all alignments are local since the specimen undulates like a piece of crumpled paper.

U.S. Pat. Pub 2011/0220796 to Nicolopoulos et al. describes a method for electron diffraction tomography of a crystal sample. A polycrystalline material is imaged by scanning the beam in raster. At each beam position diffraction patterns are obtained by precessing the beam like a top to suppress dynamic diffraction effects. The diffraction patterns are compared to reference patterns to determine the crystal orientation is then computed. A map is generated showing crystal orientation as a function of beam position. Grains in a material are readily visible by examining such a texture map. The determination of the orientation is not sufficiently accurate for aligning a sample for metrology. This technique also appears to require indexing the diffraction patterns and maintaining a library for every material in question.

SUMMARY OF THE INVENTION

An object of the invention is to provide an improved method and apparatus for aligning a crystalline sample in a charged particle beam system.

A charged particle beam is directed toward a sample to obtain a sample diffraction pattern. The sample diffraction pattern is compared with reference diffraction patterns having known misalignments to determine which reference pattern most closely matches the sample pattern. The known alignment of the best-matching reference diffraction pattern is used to correct the tilt of the sample.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
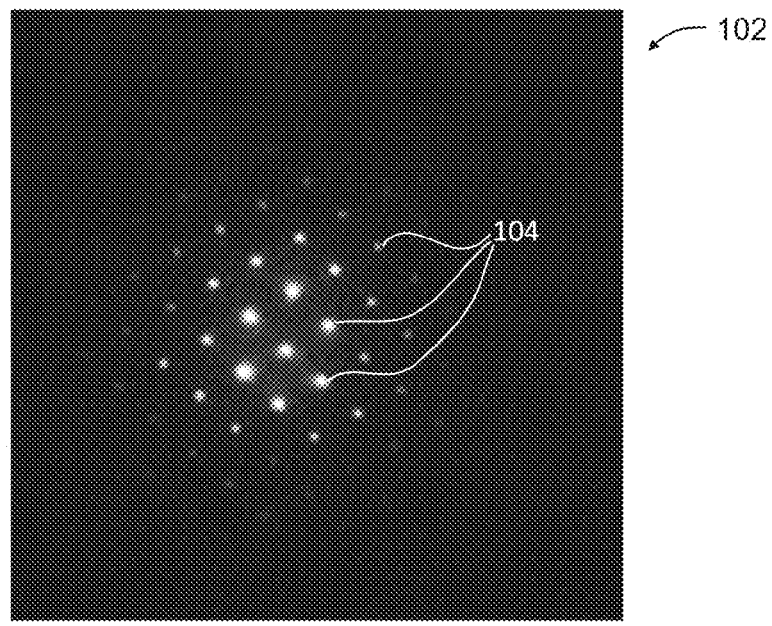
FIG. 1 shows a diffraction pattern from an aligned specimen.
Figure 2:
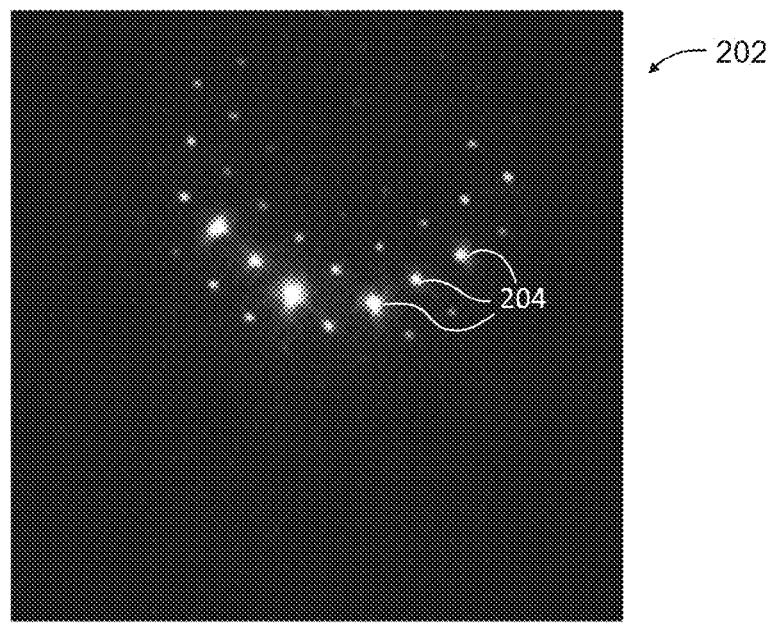
FIG. 2 shows a diffraction pattern from a misaligned specimen.
Figure 3:
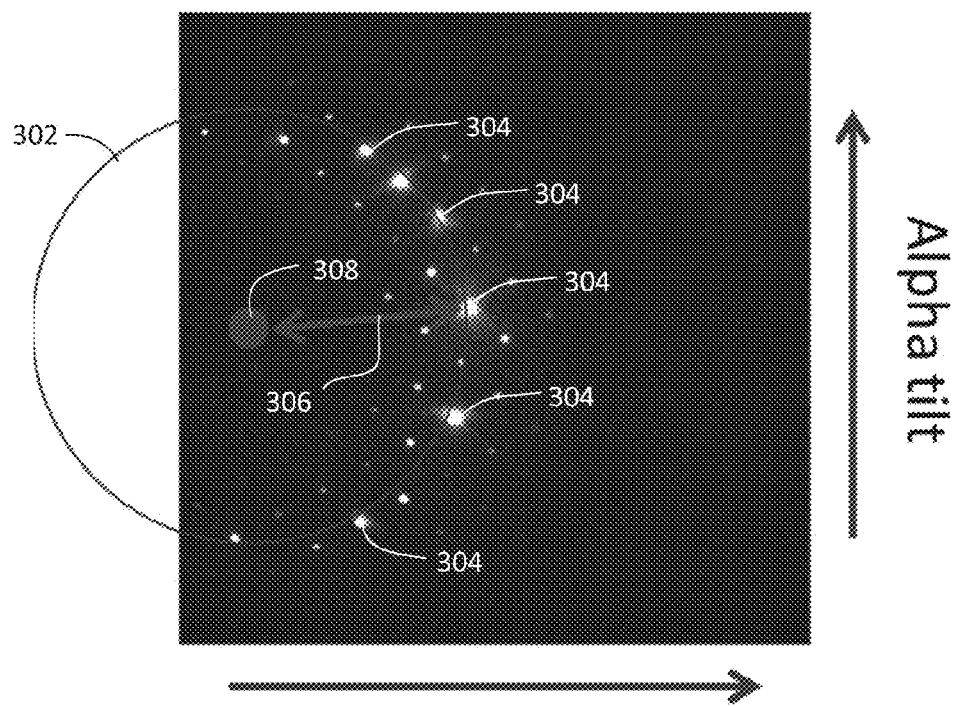
FIG. 3 shows a diffraction pattern from a misaligned sample.
Figure 4:
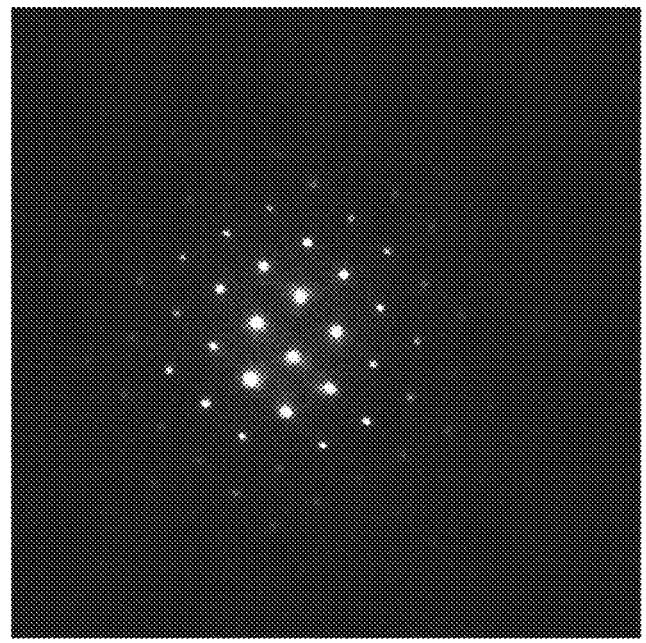
FIG. 4 shows a diffraction pattern from the sample of FIG. 3 with the misalignment corrected.
Figure 5:
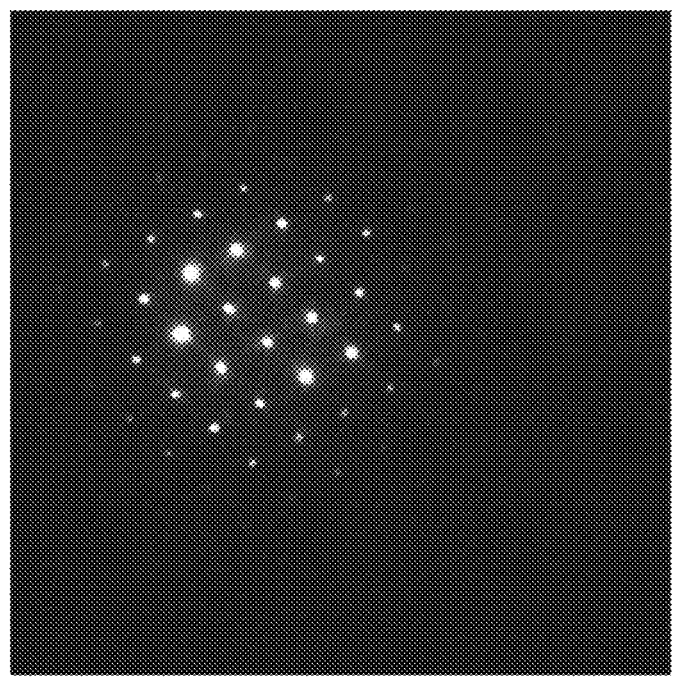
FIG. 5 shows a diffraction pattern of a misaligned sample in which it is difficult to identify a circle for calculating the misalignment.

A charged particle beam is directed toward a sample to obtain a sample diffraction pattern. The sample diffraction pattern is compared with reference diffraction patterns having known misalignments to determine which reference pattern most closely matches the sample pattern. The known tilt of the matching reference diffraction pattern is used to correct the tilt of the sample.

In some embodiments, the 'reference patterns' are not images at all—they are a list of spots. The correlation is done between a lists of spots, not between images. For example, a list of spots may include:

First column: image X position
Second column: image Y position
Third column including either:
Miller index (for indexed pattern)
Scattering angle (for unindexed pattern)
Fourth column: spot intensity The spot intensities are determined by integrating the spot pixels. Correlating a list of spots rather than pixels in two images reduces the computational burden considerably. Instead of having to consider more than a million pixels in each image, only a few dozen spots are considered.

The reference pattern 'list of spots' can be computed on the fly using a kinematical model. The kinematic model is sufficiently accurate to provide zone axis alignment of better than 1° and more preferably less than ½°, yet is sufficiently computationally efficient that reference patterns can be computed during the alignment process, without having to maintain libraries of reference patterns for every possible $\alpha$ tilt, $\beta$ tilt, sample thickness, sample type, etc.

Embodiments use a single electron diffraction pattern at a single point to determine alignment—embodiments do not require precessing the electron beam around a point or taking multiple diffraction patterns at sample points. Embodiments also do not require indexing the pattern.

Prior art methods to align a sample analyze a sample diffraction pattern to mathematically determine a sample tilt. Comparing the sample diffraction pattern to diffraction patterns having known tilts was considered impractical. Practical diffraction simulation models did not match reality sufficiently well for alignment. The reference patterns are specific to the sample material, the sample thickness, and the sample zone axis being aligned. Reference patterns are needed for each possible combination of $\alpha$ tilt and $\beta$ tilt, so a large number of reference patterns is required to accurately determine the sample tilt along both axes.

For example, if the sample is assumed to be within three degrees of alignment in both tilt axes, and one desired to determine the tilt within 0.1 degrees, then 3,600 reference patterns would be required. Generating 3,600 reference patterns and comparing each of reference patterns to the sample diffraction has been considered too computationally intense for practical applications. Applicant has found that using a simplified model for creating simulated diffraction patterns allows reference patterns to be created for comparison with the pattern detected by passing a beam through the sample. Surprisingly, applicant found that the use of a simplified simulation generates reference patterns that are sufficiently accurate to precisely align the sample. Applicant also found that comparing lists of spots instead of images greatly reduces the number of calculation, rendering the comparison method more practical in some embodiments.

Figure 7:
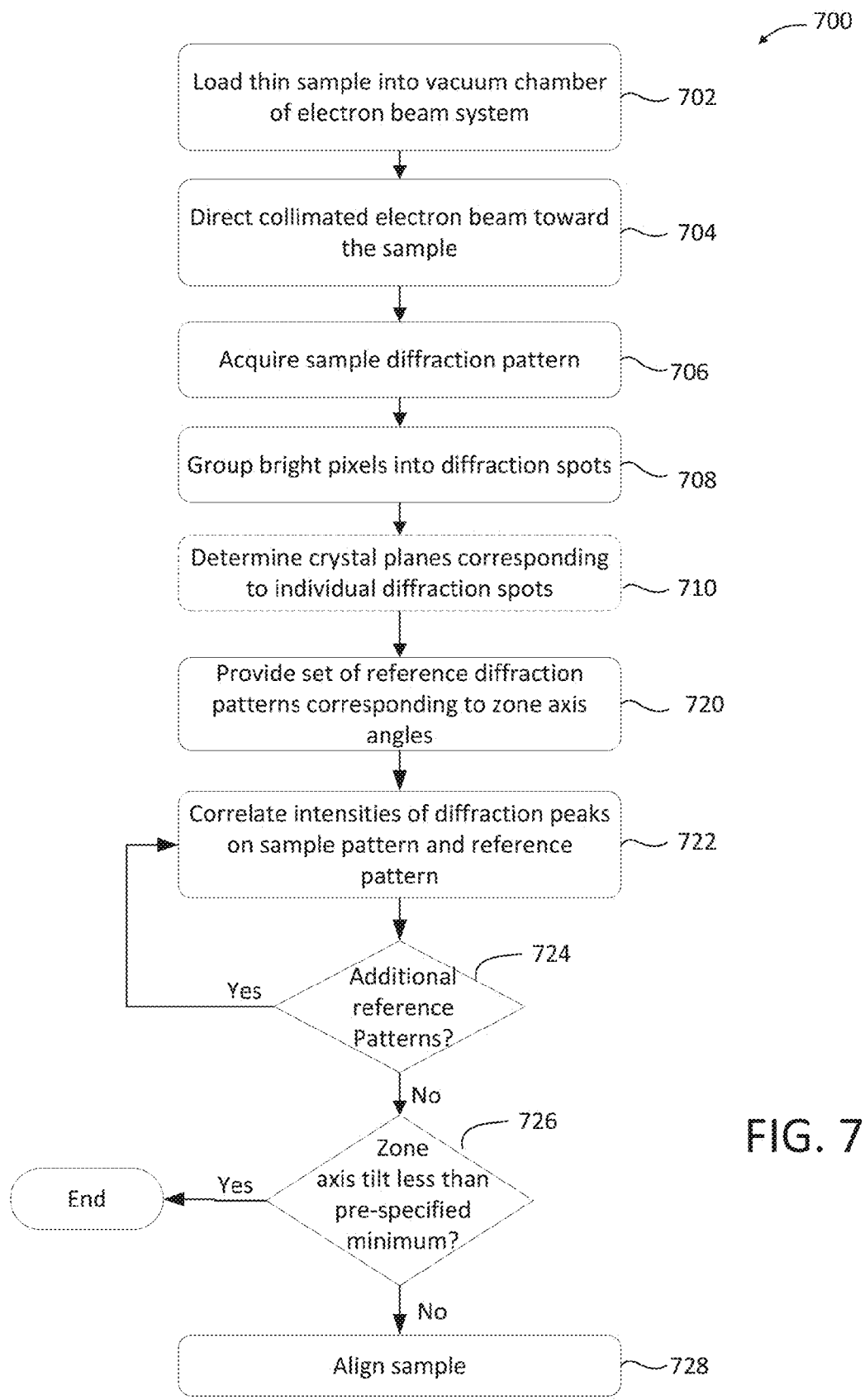
FIG. 7 is a flowchart showing a method of aligning a sample using a diffraction pattern.

FIG. 7 is flow chart 700 showing a method for measurement and correction of misalignment between an electron beam and a sample being observed using the electron beam. The method refers to a thin sample, typically less than about 250 nm in thickness, through which electrons are transmitted and diffracted. The method could also be applied to a backscattered electron diffraction pattern. Backscattered electron diffraction alignment is not limited to a thin, electron-transparent sample.

In step 702, a thin sample is loaded into the vacuum chamber of an electron beam system. In step 704, a collimated electron beam is directed toward the sample. The sample is sufficiently thin that a majority of the electrons are transmitted through the sample. In step 706, an image of the back focal plane of the objective lens is formed on an electron image-forming (pixelated) detector positioned under the sample and the image is stored in a computer memory. The image of the back focal plane will correspond to an electron diffraction pattern. A back-scattered electron diffraction pattern could also be acquired using an image-forming detector above a thicker sample that backscatters electrons.

In step 708, bright spots corresponding to diffraction peaks are identified on the image. The bright spots will typically extend over more than one pixel, and the bright pixels on the image are grouped to form a spot. In some embodiments, the center of the group of pixels can be determined to identify a location of the spot. To locate the bright spots, the brightness of each pixel in the image may be normalized, so that the brightness of each pixel is characterized by a number between "0," corresponding to a dark spot (no electrons impinging) and "1" corresponding to a maximum value. Alternatively, each pixel can be "thresholded," that is, if the brightness of a pixel is above a specified value, the pixel is assigned a value of "1" and if the pixel brightness is below the specified value, it can be assigned a value of "0". Contiguous groups of bright pixels, that is, pixels having a brightness exceeding a minimum value, are grouped to form spots. If normalized brightness is used, the edges of the spot can be determined, for example, by the pixel at which the spot drops to half the maximum value in the spot. Many other methods can be used to identify the diffraction spots.

There may be a very large number of peaks in a diffraction pattern, with the peaks of the higher crystal planes being dimmer than the peaks of the lower index planes. That is, the <100> peak will generally be brighter than the <200> peak, etc. In step 708, the number of spots identified for later use in the correlation can be limited. For example, only spot having a minimum cumulative brightness of the pixels in the spot may be identified as a diffraction spot, or only spots corresponding to crystal indices below a certain number might be used.

Figure 8:
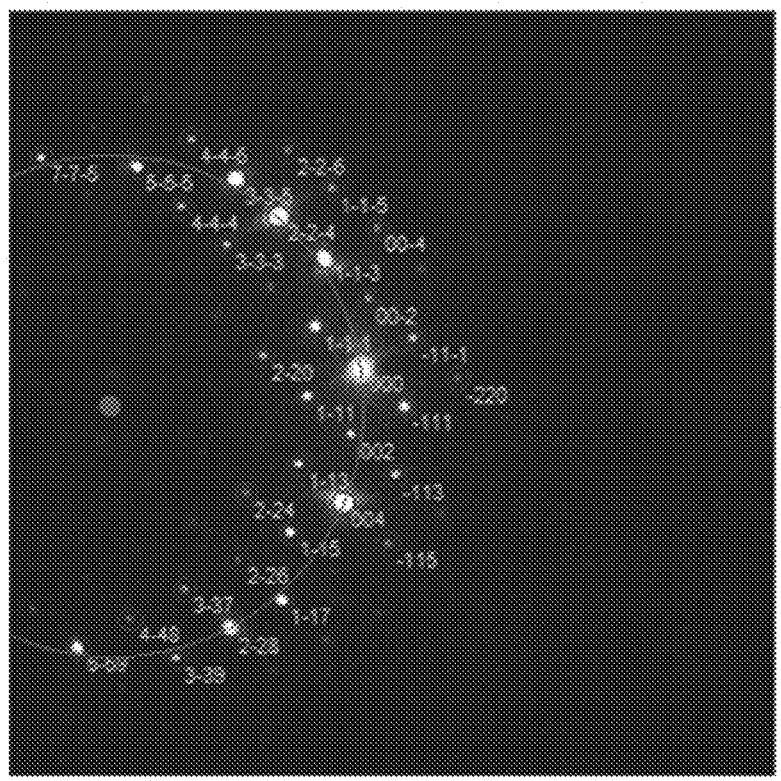
FIG. 8 shows a diffraction pattern of a misaligned sample with the diffraction peaks identified with the corresponding group of crystal planes.

In optional step 710, the diffraction spots identified in step 708 are indexed to determine the set of crystal planes corresponding to each spot. FIG. 8 shows the indexed diffraction peaks, each peak labeled with the corresponding crystal planes. The spots are indexed to assist in correlation in later step 722. Some correlation methods do not require indexing of the diffraction spots.

Figure 9:
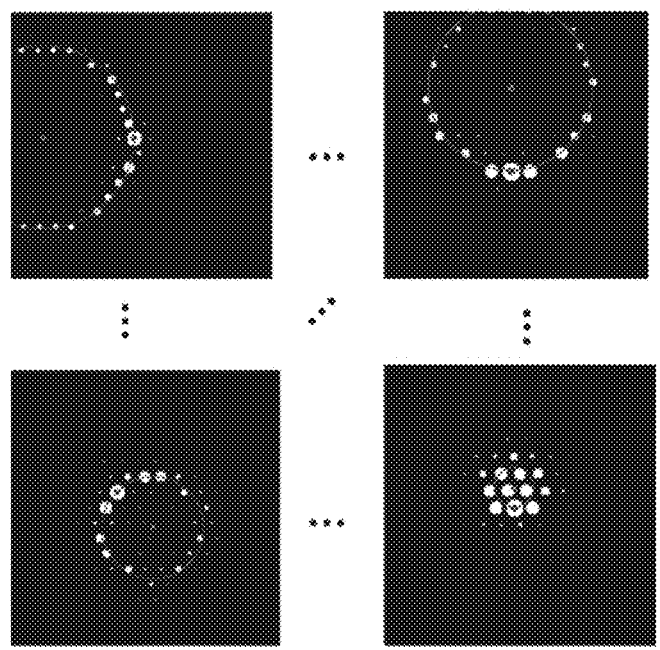
FIG. 9 shows representative reference diffraction patterns used to compare with the diffraction pattern of the sample in FIG. 8.

In step 720, a set of reference diffraction patterns are provided for comparison with the sample diffraction pattern. The set of reference diffraction patterns is typically specific to the sample material, thickness, and zone axis being aligned. The set of reference diffraction patterns includes diffraction patterns over a range of zone axis tilts along two axes relative to the electron beam. FIG. 9 shows four representative reference diffraction patterns for a 20 nm thick silicon, each corresponding to a different sample tilt of a zone axis in the <110> direction. The set of reference patterns may be generated experimentally or by simulation software. The reference patterns need not be images, but could be list of spots or simply a kinematical diffraction model. Multiple models exist for simulation of diffraction patterns, ranging in complexity and computational expense, typically in exchange for accuracy with complex crystals such as proteins. Thorough simulation involves multi-slice simulations or quantum mechanical calculations, which are computationally very expensive and require modeling the specimen structure.

For example, diffraction patterns for tilts between −3° to +3° from normal incidence with respect to the beam axis (Z-axis) may be simulated for both the α and β axes. The sampling resolution and degree of simulated misalignment can be selected based on the maximum expected misalignment and the precision required, balanced with increased computational time for simulation and later comparison. For example, reference patterns with sample tilts may be used with tilt ranges from −10° to +10° from normal incidence with respect to the beam axis, −5° to +5° from normal incidence, or −2° to +2° from normal incidence, all in the α and β axes. Possible reference pattern resolutions include 1°, 0.1°, 0.05°, or 0.01°. Other tilt angle ranges and resolutions can be used. The alignment process could be performed iteratively, with lower resolution over a wider range of tilts to provide a coarse alignment, and then using a more precise over a smaller range of tilts to achieve a final alignment. It is preferable, however, to use a single correction because tilting the sample also typically causes some lateral movement of the sample relative to the beam, which can cause the area of interest to move outside the field of view. To compensate for this movement, an elaborate and time consuming feature tracking procedure must be executed. Additionally, the mechanical accuracy of the stage limits resolution.

Simulated reference patterns may be pre-generated and retrieved for use, or the simulated patterns may be generated when required during the alignment process. To reduce the calculations required, the diffraction simulation used to generate the reference diffraction patterns can be based on a kinematic diffraction model, ignoring contributions from dynamic diffraction. Kinematic diffraction models make assumptions about the behavior of the charged particles as they pass through the sample. For example, the incident beam is considered homogenous throughout the entire sample, inelastic scattering is ignored, as is secondary diffraction of diffracted beams. In some embodiments, a simplistic and computationally efficient means of computing simulated diffraction patterns comprises upweighting the integrated diffraction peaks, as a function of scattering angle, to zoom in on Z axis excitation factor effects, which are determined by crystal orientation. There are many factors governing the spot intensity, but for alignment purposes we are only interested in how the crystal alignment impacts the spot intensity. A goal of the simulation is to suppress all other effects and zoom in on these effects. The effects of interest are called excitation factors. These diffraction simulation strategies greatly reduce the computational expense of extensive diffraction simulation. Applicant has found surprisingly that the exclusion of dynamic diffraction speeds simulation without impacting the accuracy of determination and correction of sample tilts for thin samples. For a highly symmetric crystal, such as a face-centered-cubic crystal, the simulated diffraction patterns can be generated relatively quickly to facilitate "on the fly" generation of pattern corresponding to different tilts.

Alternatively, the reference diffraction patterns could be sample diffraction pattern from samples having known tilts with respect to the zone axis. For example, a sample could be aligned using a prior art method and then tilted by known amounts to create reference diffraction patterns at various known tilts. A different sample would be required for different types of sample material, different sample thickness, and different zone axes. The intensity of each pixel corresponding to each spot is integrated to determine an intensity for each spot. "Intensity" corresponds to the number of electrons impinging, which corresponds to the brightness on an electron diffraction image. "Intensity" may be determined in a simulation without actually producing an image. The reference diffraction patterns, in this case, must be indexed so that spots are identified with a particular set of crystal planes.

Each reference pattern includes a table of indexed peaks and/or a table of peak intensities. These tables can be used for correlating the reference patterns to the sample pattern. Because the tables are used for correlating the diffraction patterns instead of images, it is not necessary to align and scale different images, which would be too computationally expensive to be practical.

Next the intensities of the diffraction peaks on the sample pattern are correlated with the intensities of the corresponding peaks on one of the reference patterns, or intensities from a kinematical diffraction model, in step 722 to determine a correlation score for that reference pattern. There are many ways to correlate the intensities of the peaks and two are described below with reference to FIGS. 11 and 12. Step 722 is repeated with each of the reference patterns until decision block 724 determines that all the reference patterns have been correlated with the sample pattern. For example, if an exhaustive set of references grids are generated, for example, between −10° and +10° in α and beta β tilt in steps of 0.1°, step 722 would be repeated 40,000 times. Alternatively, the process can be stopped if a reference pattern has a pre-specified high correlation score.

Figure 10:
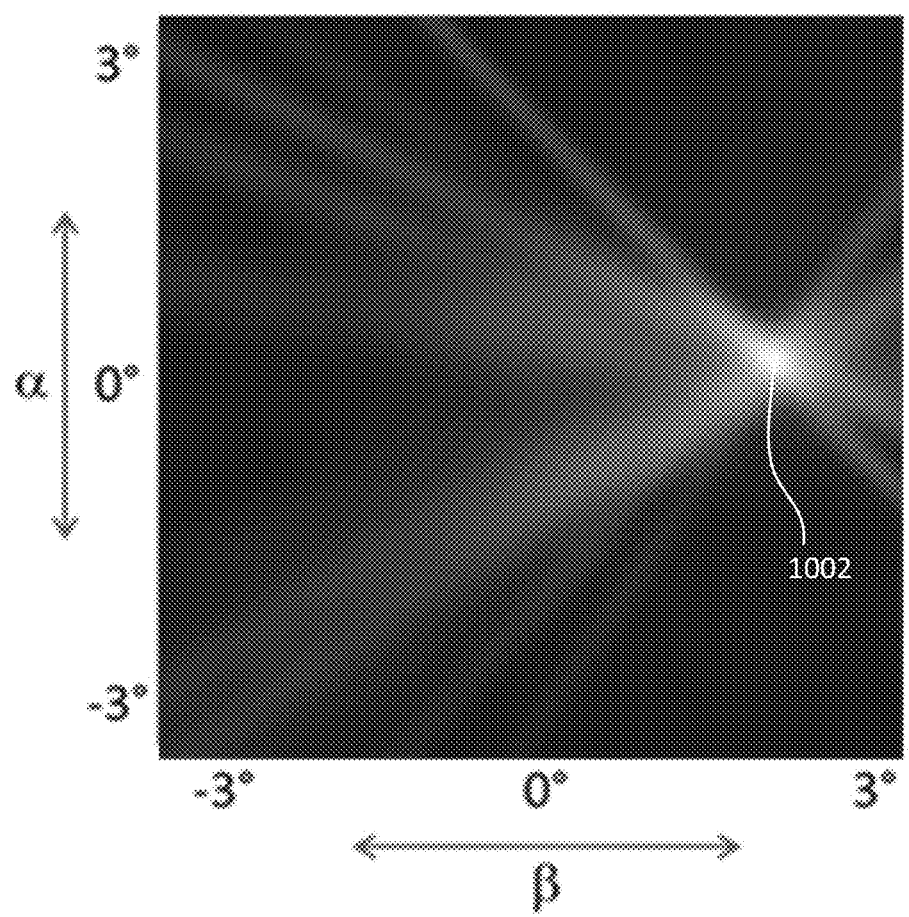
FIG. 10 shows a correlation graph of the sample of FIG. 8 with the brightness indicating the level of correlation at different angles along the $\alpha$ and $\beta$ tilt axes.

FIG. 10 shows a correlation graph with β tilt on the x-axis and α tilt on the y axis. The brighter the spot on the correlation graph, the higher the correlation score between the sample diffraction pattern and the simulated pattern at the corresponding β tilt and α tilt. The correlation graph was constructed by modelling all 3,600 combinations of α tilts between −3° and +3° and β tilts between −3° and +3°, in increments of 0.1° in both α tilts and β tilt. FIG. 10 shows the highest correlation point 1002 to be at approximately 0° of α tilt and 2° of β tilt.

The known zone axis tilt of the best-match reference pattern is presumed to be the actual zone axis tilt of the sample. Decision block 726 determines whether or not the sample zone axis tilt is less than a pre-specified minimum, for example, less than 1.0° or less than 0.5°. If the sample zone axis tilt is less than the pre-specified minimum, the process is ended because the sample is sufficiently aligned. If decision block 726 determines that the zone axis tilt is not less than the pre-specified minimum, the angle between the beam and the sample surface is altered to correct for the determined zone axis tilt in step 728. The sample stage can be physically tilted to align the zone axis with the electron beam. It is desirable to limit the number of stage tilts, as tilting the stage induces a XYZ translation in the specimen, causing the area of interest to move outside the field of view. To compensate an elaborate and time consuming feature tracking procedure must be executed. The invention can allow the crystal to be tilted to its optimal orientation using only one stage tilt.

One method of correlating the position of the peaks on the sample diffraction pattern and the reference diffraction pattern in step 722 is simple multiplication of the brightnesses of pixels corresponding to diffraction peaks in the sample pattern and the reference pattern. The brightness of a pixel in the sample diffraction pattern would be non-zero if it represented a part of a diffraction peak. If there is no diffraction peak at the corresponding pixel in the reference diffraction pattern, then the brightness value of the corresponding pixel in the reference pattern will be 0 or close to zero. The product of the brightnesses of the two pixels will be 0 or close to 0 if the pixel in either the sample pattern or the reference pattern is 0. If there is a peak in the reference pattern, then the brightness value in the reference pattern will be close to 1, and the product of the brightnesses in the acquired pattern and the reference pattern will be close to 1.

Figure 11:
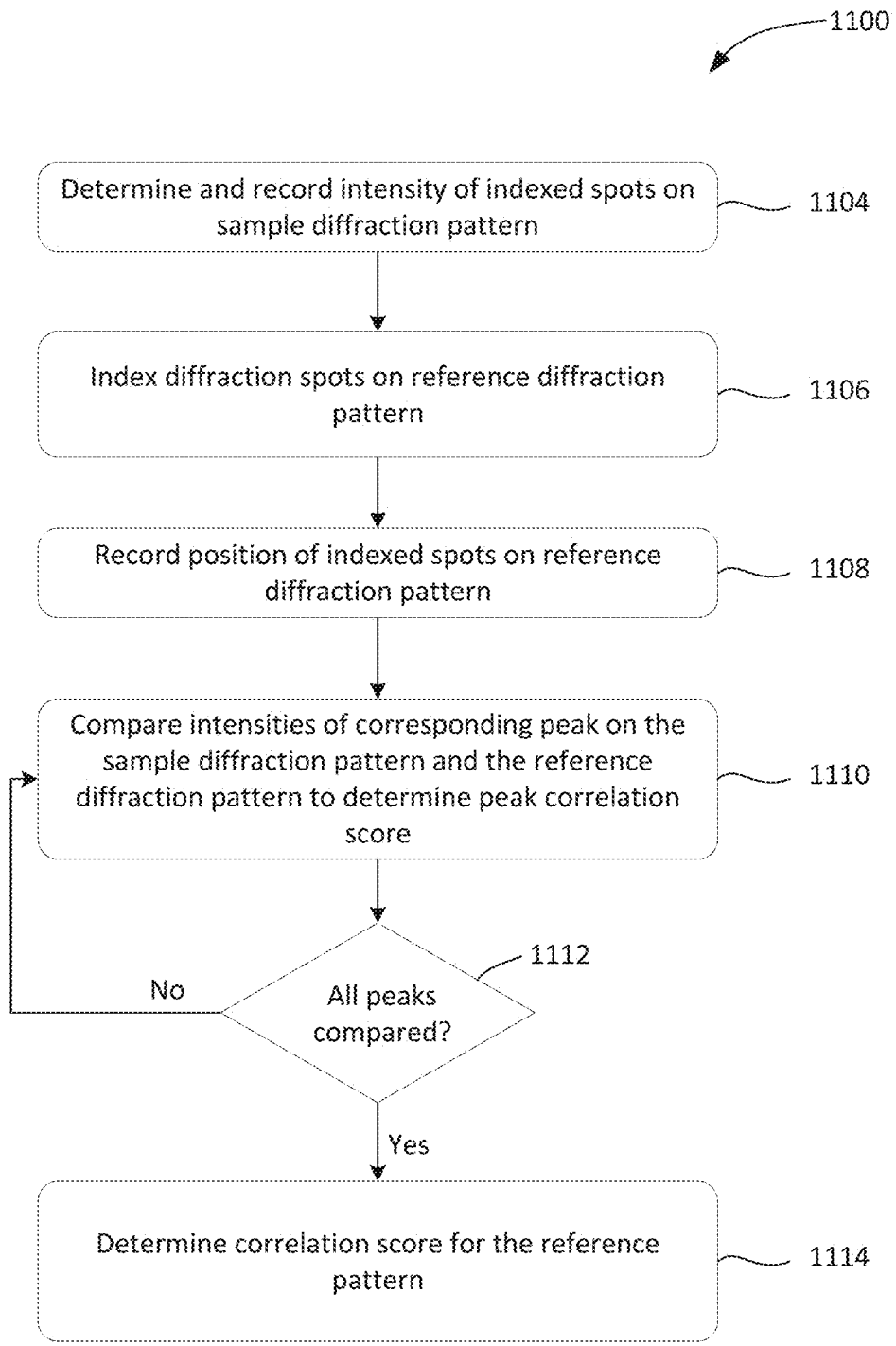
FIG. 11 is a flow chart showing a method of correlating a sample pattern with a reference pattern.

FIG. 11 is a flow chart 1100 that describes a method of determining a correlation score between a sample diffraction pattern and a reference pattern as required in step 722 of FIG. 7. The bright spots that were identified in step 708 on the sample diffraction pattern are indexed in step 710. In step 1104 the intensity of each of the indexed peaks is determined and recorded. The indexed peak along with its intensity is sufficient to determine crystal orientation. By reducing the sample image to a list of peaks and only comparing the peaks, rather than comparing pixels on images (1,000×1,000 pixel image has 1,000,000 pixels), the amount of information to be processed is reduced by a factor of greater than 10,000.

In step 1106, the bright spots on a reference diffraction pattern are indexed and in step 1108, the intensity of each of the indexed peaks is determined and recorded. Steps 1106 and 1108 can also be performed when the reference set is created. As described above, the reference set can be created prior to the alignment process or can be created as necessary during the alignment process. In step 1110, the intensities of the corresponding peak on the sample diffraction pattern and on the reference diffraction pattern are compared to determine a peak correlation score. The individual peaks are correlated until all peaks under consideration are correlated as shown in decision block 1112, and then a pattern correlation score is determined in step 1114 from the peak correlation score, for example by summing or performing a weighted average of the peak correlation scores. After the correlation, the alignment process continues at step 724 of FIG. 7.

Figure 12:
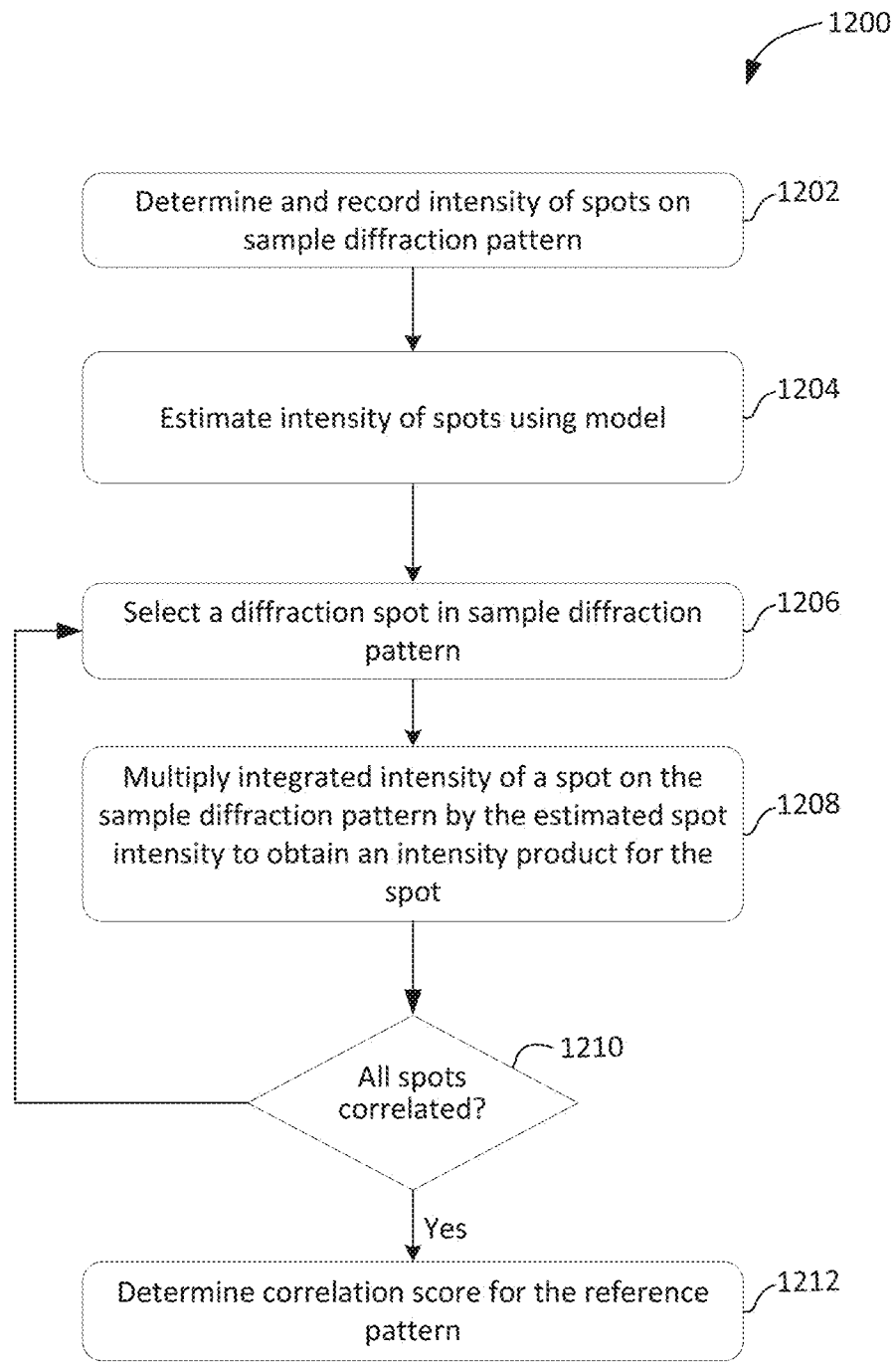
FIG. 12 is a flow chart showing another method of correlating a sample pattern with a reference pattern.

FIG. 12 is a flowchart 1200 showing another method of correlating the sample diffraction pattern with the 'reference patterns' for step 722 of FIG. 7. In the method of FIG. 12, indexing the peaks not required, although indexing could be used in the calculation of the estimated intensity. In step 1202, the intensity of each of the sample spots is determined and recorded to create a list of spots. By reducing the image to a list of spots and only comparing the spots, rather than comparing pixels on images, the amount of information to be processed is reduced by a factor of greater than 10,000.

In step 1204, the intensity of each of the spots is estimated using a kinematical diffraction model. The spot estimated intensity will depend on the model input parameters such as alpha and beta tilt, sample material type, and thickness. The goal is to find a set of model parameters that best match the observed data. For a kinematical model only the spot scattering angle is necessary to compute its estimated intensity; hence indexing is not required. The scattering angle can be obtained from a diffraction pattern having a calibrated camera length. The kinematical model is as follows: The observed diffraction pattern acts as a plane of the reciprocal lattice with relrods oriented normal to the plane, and the model consists of the Ewald sphere. The estimated intensity is calculated based on how the much the Ewald sphere cuts the relrods as described in 17.1A in William, et al., *Transmission Electron Microscopy A Textbook for Materials Science*, Springer, (1996) (pp. 197-366) ("Williams, et al."). The Ewald sphere orientation is based on alpha and beta. The relrod size is based on specimen thickness. Additionally, the estimated intensities are also scaled by atomic scatter factors estimated using the Kromer-Mann methods, and by Debye-Waller thermal B factors. Techniques for determining the intensities of the spots are described, for example, in B. Rupp, *Biomolecular Crystallography Principles, Practice,*

Figure 6:
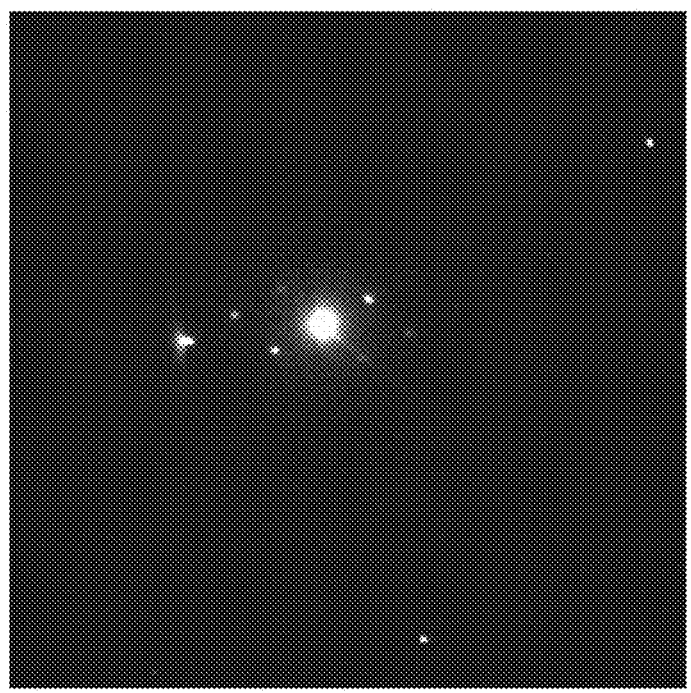
FIG. 6 shows another diffraction pattern of a misaligned sample in which it is difficult to identify a circle for calculating the misalignment.

*and Application to Structural Biology*, Garland Science (2009) (pp. 197-313) and in Williams, et al. That the diffraction patterns do not need be indexed is an advantage of the method described in FIG. 12 because some diffraction patterns, such as, the diffraction pattern in FIG. 6, are exceedingly difficult to index. In step 1206, a first spot on the sample is selected.

In step 1208, the integrated intensity of the selected spot on the sample diffraction pattern is multiplied by the estimated spot intensity as a function of model input parameters. Here we are fitting a kinematical diffraction model to the data rather than matching reference diffraction patterns as in FIG. 11. This is a difference between the methods of FIGS. 11 and 12. In the method of FIG. 12, there are no corresponding spots—just computed estimated intensities for the spot in the observed pattern. The estimated intensity is preferably based on 1) scattering angle 2) model parameters. The process is repeated for all the spots to be used in the correlation. When it is determined in decision block 1210 that all spots have correlated, a correlation score, corresponding, for example, to the sum of correlation scores for each spot, is determined in step 1212. For example, the pattern correlation score could be the sum of the correlation scores for each spot, or the pattern correlation score could be a weighted sum of the spot correlation scores. Diffraction peaks below a minimum brightness may be excluded. After the correlation, the alignment process continues at step 724 of FIG. 7.

Figure 13:
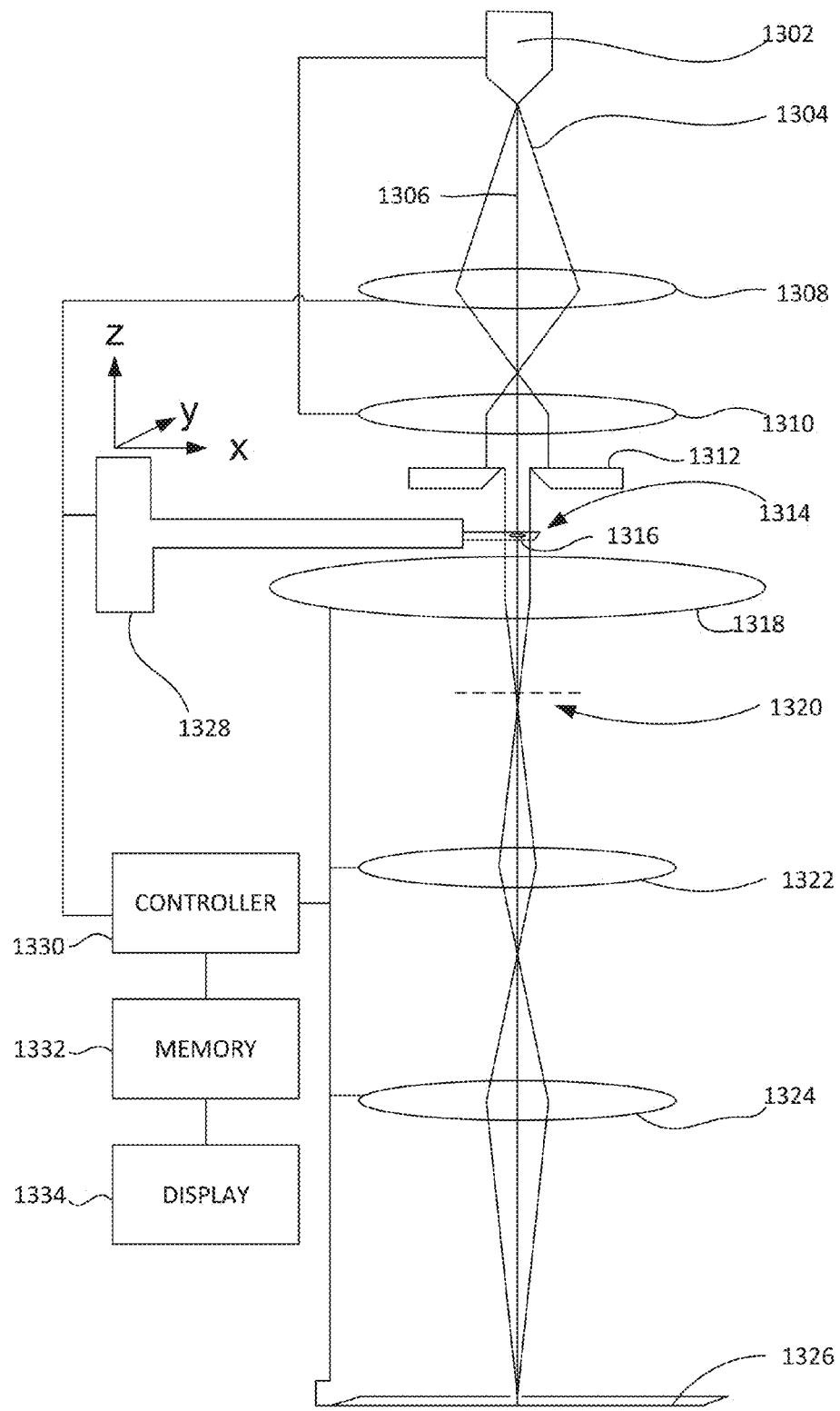
FIG. 13 shows schematically a system that can be used for carrying aligning a sample.

FIG. 13 shows a schematic view of a charged particle apparatus in which a diffraction pattern can be acquired and a sample can be aligned using methods described herein. An electron gun 1302 produces a beam 1304 of electrons defining a beam axis 1306. The electron beam 1304 is focused and collimated by condenser lenses 1308 and 1310. Condenser aperture 1312 limits the beam current and can also be used to shape the beam, if desired. In diffraction mode, the trajectories of the electrons making up the beam are parallel after passing through the condenser lenses and aperture. A thin specimen 1316 is placed into the tip of a sample holder 1328. The sample holder is inserted into the charged particle apparatus such that the sample is in a location 1314 where it can be irradiated with the electron beam. In some embodiments, the sample holder is configured to tilt the sample with respect to the beam axis 1306. Tilting the sample holder may be automatic, manual, or automatic after manual initiation. In other embodiments, the tilt between the sample and the beam axis is accomplished with deflection coils above and below (not shown for clarity) the irradiation location 1314.

After passing through the sample, the electrons are focused by objective lens 1318. With the lenses configured as shown in FIG. 13, a diffraction pattern is created at the back focal plane 1320 of the objective lens 1318. Projector lenses 1322 and 1324 focus the diffraction pattern on the detector 1326. Detector 1326 is an image forming detector, which typically includes an array of individual detection cells or pixels in which the brightness of each point or pixel in the image corresponds to the number of electrons impinging on the corresponding pixel on the detector. Detector 1326 can be a known pixelated TEM detector, such as a CMOS Active Pixel Sensor, a scintillator-CCD detector, or a fluorescent screen that is imaged on a light sensitive camera.

The lenses, detector, sample holder, and electron gun are in communication with and may be controlled by a controller 1330. The controller retrieves instructions and other data stored in non-volatile memory 1332, and can display information on display 1334. The memory 1332 may include computer instructions for carrying the processes described herein, including the processes in FIGS. 7 and 11-13. The methods described herein can be partly or fully automated and operated under the control of controller 1330. The methods described herein facilitate automation of the alignment process. The controller 1330 can then direct the charged particle beam to carry out the methods described herein in accordance with the instructions in memory 1332.

While reference may be made to electron beam systems, the method and apparatus described herein are not limited to electrons, and may also be used with other types of charged particles.

Some embodiments of the invention provide a method of correcting orientational misalignment between a charged particle beam axis and a zone axis of a crystalline sample, comprising: irradiating the crystalline sample with the charged particle beam; recording a sample diffraction pattern, the charged particle diffraction pattern composed of multiple sample diffraction spots; correlating the intensity of the diffraction spots in the sample diffraction pattern with the intensity of corresponding diffraction spots of multiple reference diffraction patterns, each of the reference diffraction patterns corresponding to a known misalignment between the charged particle beam axis and the crystal zone axis; and adjusting the sample orientation using the known misalignment of the reference pattern having the closest correlation with the sample diffraction pattern.

In some embodiments, the multiple reference diffraction patterns are generated using a computer simulation.

In some embodiments, each of the multiple reference diffraction patterns comprises a list of spots; and correlating the intensity of the diffraction spots in the sample diffraction pattern with the intensity of corresponding diffraction spots of multiple reference diffraction patterns comprises correlating the intensity of a list of sample diffraction spots with reference lists of spots.

In some embodiments, correlating the intensity of a list of sample diffraction spots with reference lists of spots comprises using Miller indices to match spots in list of sample diffraction spots with spots in the reference lists of spots.

In some embodiments, correlating the intensity of a list of sample diffraction spots with reference lists of spots comprises using scattering angles to match spots in list of sample diffraction spots with spots in the reference lists of spots.

In some embodiments, the list of spots for the multiple reference diffraction patterns are created using a kinematic scattering model.

In some embodiments, creating the multiple reference diffraction patterns using a computer simulation comprises using a scattering model that excludes contribution from dynamic scattering.

In some embodiments, the intensities of the spots on the reference diffraction patterns are determined without indexing the reference diffraction patterns.

In some embodiments, the intensities of the spots on the reference diffraction patterns are determined by calibrating the reference diffraction patterns.

In some embodiments, creating the multiple reference diffraction patterns using a computer simulation comprises upweighting the integrated diffraction peaks to zoom in on Z axis excitation factor effects.

In some embodiments, irradiating the crystalline sample with the charged particle beam comprises irradiating a sample having a face-centered cubic crystal structure.

In some embodiments, the multiple references diffraction patterns comprise a tilt series representing sample tilts in two dimensions.

Some embodiments of the invention provide a method of correcting misalignment between a charged particle beam axis and a zone axis of a crystalline sample, comprising: irradiating the crystalline sample with the charged particle beam; recording a charged particle diffraction pattern; correlating the sample diffraction pattern with multiple reference diffraction patterns, each of the reference diffraction patterns corresponding to a known misalignment between a charged particle beam axis and a crystal zone axis; and adjusting the sample orientation using the known misalignment of the reference diffraction most closely correlated to the sample diffraction pattern.

In some embodiments, the multiple reference diffraction patterns correspond to misalignments along two orthogonal rotational axes.

In some embodiments, the scattering model excludes contribution from dynamic scattering.

In some embodiments, correlating the sample diffraction pattern with multiple reference diffraction patterns comprises correlating the intensity of corresponding diffraction peak.

In some embodiments, correlating the sample diffraction pattern with multiple reference diffraction patterns comprises correlating the brightness of pixels in the sample diffraction pattern with the brightness of pixels in the reference diffraction patterns.

In some embodiments, correlating the brightness of pixels in the sample diffraction pattern with the brightness of pixels in the reference diffraction patterns comprises correlating only pixels that have non-zero brightness in either the sample diffraction pattern or in the reference diffraction pattern being correlated.

In some embodiments, correlating only pixels that have non-zero brightness in either the sample diffraction pattern or in the reference diffraction pattern being correlated the diffraction comprises correlating bright pixels in the sample diffraction pattern with corresponding locations in the sample diffraction pattern regardless, the pixels being correlated based on physical location rather than index.

Some embodiments of the invention provide a charged particle beam apparatus, comprising: a source of charged particles; a charged particle optical column for forming a collimated beam of charged particles; and a controller with memory storing computer instructions for: irradiating the crystalline sample with the charged particle beam; recording a charged particle diffraction pattern; and correlating the sample diffraction pattern with multiple reference diffraction patterns, each of the reference diffraction patterns corresponding to a known misalignment between a charged particle beam axis and a crystal zone axis to determine the misalignment between the sample zone axis and the beam.

In some embodiments, the charged particle beam apparatus further comprises adjusting the sample orientation using the known misalignment of the reference diffraction most closely correlated to the sample diffraction pattern.

In some embodiments, the sample is mounted on a stage with adjustable tilt in at least two dimensions.

In some embodiments, the memory also stores pre-generated simulated diffraction patterns.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

It should be recognized that parts of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

The various features described herein may be used in any functional combination or sub-combination, and not merely those combinations described in the embodiments herein. As such, this disclosure should be interpreted as providing written description of any such combination or sub-combination.

Although the present invention and its advantages have been described in detail, it should be understood that various changes, substitutions and alterations can be made to the embodiments described herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. A method of correcting orientational misalignment between a charged particle beam axis of a charged particle beam microscope and a zone axis of a crystalline sample, comprising:
   irradiating, along the charged particle beam axis, the crystalline sample with a collimated beam of charged-particles;
   recording a sample diffraction pattern composed of multiple sample diffraction spots;

correlating the intensity of diffraction spots in the sample diffraction pattern with the intensity of corresponding diffraction spots of multiple reference diffraction patterns, each of the reference diffraction patterns corresponding to a known misalignment between the charged particle beam axis and the zone axis of the crystalline sample;

adjusting the relative orientation of the crystalline sample and the charged particle beam axis to correct the misalignment of the zone axis of the crystalline sample and the charged particle beam axis using the known misalignment of the reference diffraction pattern having the closest correlation with the sample diffraction pattern; and observing the crystalline sample using the charged particle beam microscope after adjusting the relative orientation of the crystalline sample and the charged particle beam axis, wherein the recording of only a single sample diffraction pattern is required for adjusting to correct the orientation of the crystalline sample.

2. The method of claim 1 in which the multiple reference diffraction patterns are generated using a computer simulation.

3. The method of claim 2 in which:
each of the multiple reference diffraction patterns comprises a list of spots; and
correlating the intensity of the diffraction spots in the sample diffraction pattern with the intensity of corresponding diffraction spots of multiple reference diffraction patterns comprises correlating the intensity of a list of sample diffraction spots with reference lists of spots.

4. The method of claim 3 in which correlating the intensity of a list of sample diffraction spots with reference lists of spots comprises using Miller indices to match spots in list of sample diffraction spots with spots in the reference lists of spots.

5. The method of claim 3 in which correlating the intensity of a list of sample diffraction spots with reference lists of spots comprises using scattering angles to match spots in list of sample diffraction spots with spots in the reference lists of spots.

6. The method of claim 3 in which the list of spots for the multiple reference diffraction patterns are created using a kinematic scattering model on the fly without maintaining libraries of reference patterns.

7. The method of claim 2 in which creating the multiple reference diffraction patterns using a computer simulation comprises using a scattering model that excludes or ignores contribution from dynamic scattering.

8. The method of claim 2 in which the intensities of the spots on the reference diffraction patterns are determined without indexing the reference diffraction patterns.

9. The method of claim 8 in which the intensities of the spots on the reference diffraction patterns are determined by calibrating the reference diffraction patterns.

10. The method of claim 2 in which creating the multiple reference diffraction patterns using a computer simulation comprises upweighting the integrated diffraction peaks to zoom in on Z axis excitation factor effects.

11. The method of claim 1 in which the multiple reference diffraction patterns comprise a tilt series representing sample tilts in two dimensions.

12. A method of correcting misalignment between a charged particle beam axis of a charged particle beam microscope and a zone axis of a crystalline sample, comprising:

irradiating along the charged particle beam axis the crystalline sample with a collimated beam of the charged-particles;

recording a sample diffraction pattern;

correlating the sample diffraction pattern with multiple reference diffraction patterns, each of the reference diffraction patterns corresponding to a known misalignment between a charged particle beam axis and a crystal zone axis;

adjusting the relative orientation of the crystalline sample and the charged particle beam axis to correct the orientation of the crystalline sample using the known misalignment of the reference diffraction pattern most closely correlated to the sample diffraction pattern; and observing, using the charged particle beam microscope, the crystalline sample after adjusting the relative orientation of the crystalline sample and the charged particle beam axis, wherein the recording of only a single sample diffraction pattern is required for adjusting to correct the orientation of the crystalline sample.

13. The method of claim 12 in which the multiple reference diffraction patterns are generated using a computer simulation.

14. The method of claim 13 in which:
each of the multiple reference diffraction patterns comprises a list of spots; and
correlating the sample diffraction pattern with multiple reference diffraction patterns comprises correlating the intensity of a list of sample diffraction spots with reference lists of spots.

15. The method of claim 14 in which creating the multiple reference diffraction patterns using a computer simulation comprises generating multiple reference diffraction patterns using a kinematic scattering model.

16. The method of claim 15 in which the scattering model excludes or ignores contribution from dynamic scattering.

17. The method of claim 14 in which creating the multiple reference diffraction patterns using a computer simulation comprises upweighting the integrated diffraction peaks to zoom in on Z axis excitation factor effects.

18. The method of claim 12 in which the multiple reference diffraction patterns comprise a tilt series representing sample tilts in two dimensions.

19. The method of claim 12 in which correlating the sample diffraction pattern with multiple reference diffraction patterns comprises correlating the brightness of pixels in the sample diffraction pattern with the brightness of pixels in the reference diffraction patterns.

20. A charged particle beam apparatus, comprising:
a source of charged particles;
a charged particle optical column for forming a collimated beam of charged particles; and
a controller with memory storing computer instructions for:
irradiating a crystalline sample with the collimated beam of the charged particles;
recording a sample diffraction pattern;
correlating the sample diffraction pattern with multiple reference diffraction patterns, each of the reference diffraction patterns corresponding to a known misalignment between a charged particle beam axis and a crystal zone axis to determine the misalignment between the zone axis of the crystalline sample and the charged particle beam axis;
adjusting the relative orientation of the crystalline sample and the charged particle beam axis to correct the crystalline sample orientation using the known misalignment of the reference diffraction pattern most closely correlated to the sample diffraction pattern; and observing, using the charged particle beam apparatus, the crystalline sample after adjusting the relative orientation of the crystalline sample and the charged particle beam axis, wherein determining the misalignment between the zone axis of the crystalline sample and the charged particle beam axis requires recording only a single sample diffraction pattern.

\* \* \* \* \*